(12) United States Patent
Farooq et al.

(10) Patent No.: US 9,040,418 B2
(45) Date of Patent: May 26, 2015

(54) ENHANCED CAPTURE PADS FOR THROUGH SEMICONDUCTOR VIAS

(71) Applicant: International Business Machines Corporation, Armonk, NY (US)

(72) Inventors: Mukta G. Farooq, Hopewell Junction, NY (US); John A. Griesemer, Salt Point, NY (US); Gary Lafontant, Elmont, NY (US); Kevin S. Petrarca, Newburgh, NY (US); Richard P. Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 12 days.

(21) Appl. No.: 14/076,233

(22) Filed: Nov. 10, 2013

(65) Prior Publication Data

US 2014/0127904 A1 May 8, 2014

Related U.S. Application Data

(62) Division of application No. 13/670,694, filed on Nov. 7, 2012, now Pat. No. 8,772,949.

(51) Int. Cl.
| | |
|---|---|
| H01L 23/48 | (2006.01) |
| H01L 23/52 | (2006.01) |
| H01L 29/40 | (2006.01) |
| H01L 21/44 | (2006.01) |
| H01L 21/768 | (2006.01) |

(52) U.S. Cl.
CPC .... H01L 21/76898 (2013.01); H01L 21/76877 (2013.01)

(58) Field of Classification Search
USPC .......... 257/774, E23.143, E23.145; 438/667, 438/450
See application file for complete search history.

(56) References Cited

U.S. PATENT DOCUMENTS

| | | | | |
|---|---|---|---|---|
| 7,285,867 B2* | 10/2007 | Matsuzaki et al. | | 257/787 |
| 2010/0218816 A1* | 9/2010 | Guha et al. | | 136/256 |
| 2011/0057326 A1* | 3/2011 | Kai et al. | | 257/774 |
| 2011/0089571 A1* | 4/2011 | Matsuo | | 257/774 |
| 2011/0177655 A1* | 7/2011 | Chiou et al. | | 438/119 |

FOREIGN PATENT DOCUMENTS

| | | |
|---|---|---|
| EP | 2043161 | 4/2009 |
| EP | 2068369 | 6/2009 |
| KR | 10-2012-0071921 | 7/2012 |

OTHER PUBLICATIONS

International Search Report/Written Opinion PCT/US2013/068369; Feb. 26, 2014.

\* cited by examiner

*Primary Examiner* — Evan Pert
*Assistant Examiner* — Gustavo Ramallo
(74) *Attorney, Agent, or Firm* — Ira D. Blecker; Steven J. Meyers

(57) ABSTRACT

Method of forming a capture pad on a semiconductor substrate. The method includes providing a semiconductor substrate having an active side and an inactive side and having a plurality of unfilled TSVs extending between the active side and the inactive side; filling the TSVs with a metal; defining capture pad areas on at least one of the active side and the inactive side adjacent to the TSVs, the defined capture pad areas comprising insulator islands and open areas; filling the open areas with the same metal to form a capture pad in direct contact with each of the TSVs, each of the capture pads having an all metal portion that follows an outline of each of the TSVs.

19 Claims, 5 Drawing Sheets

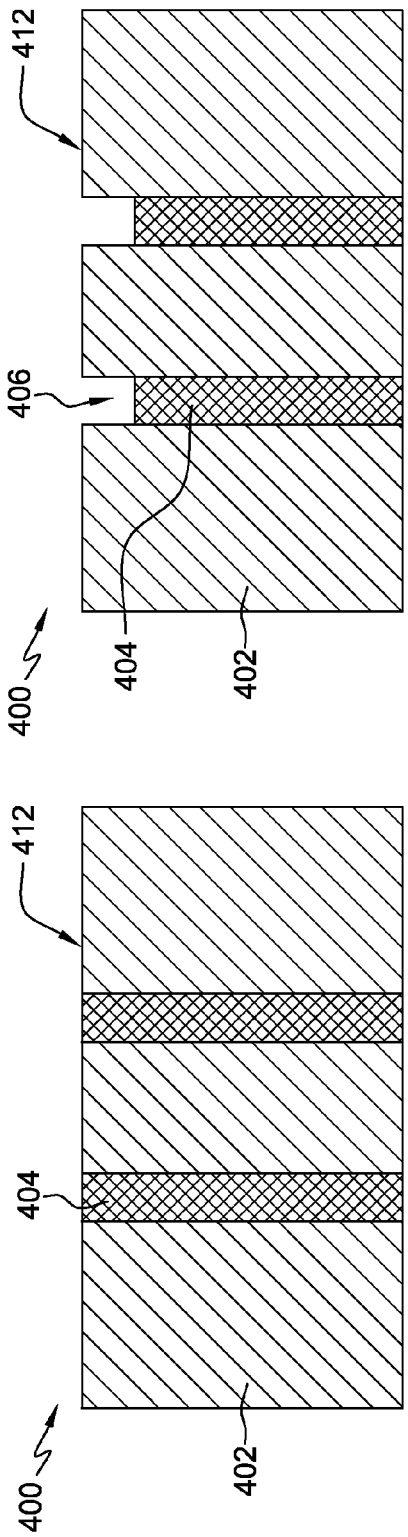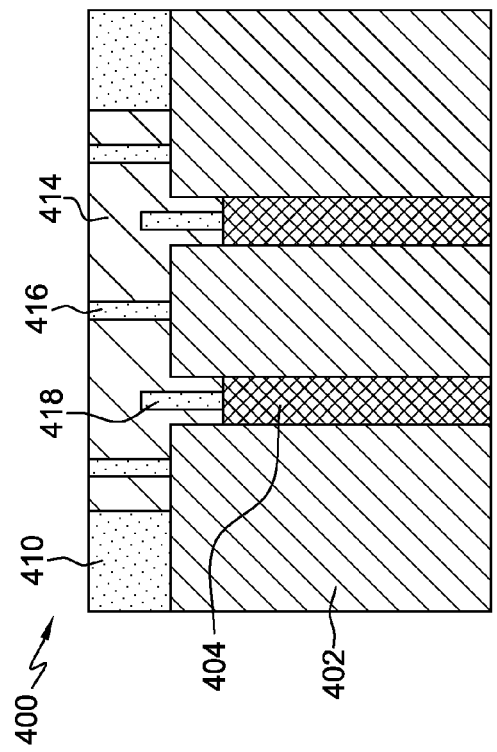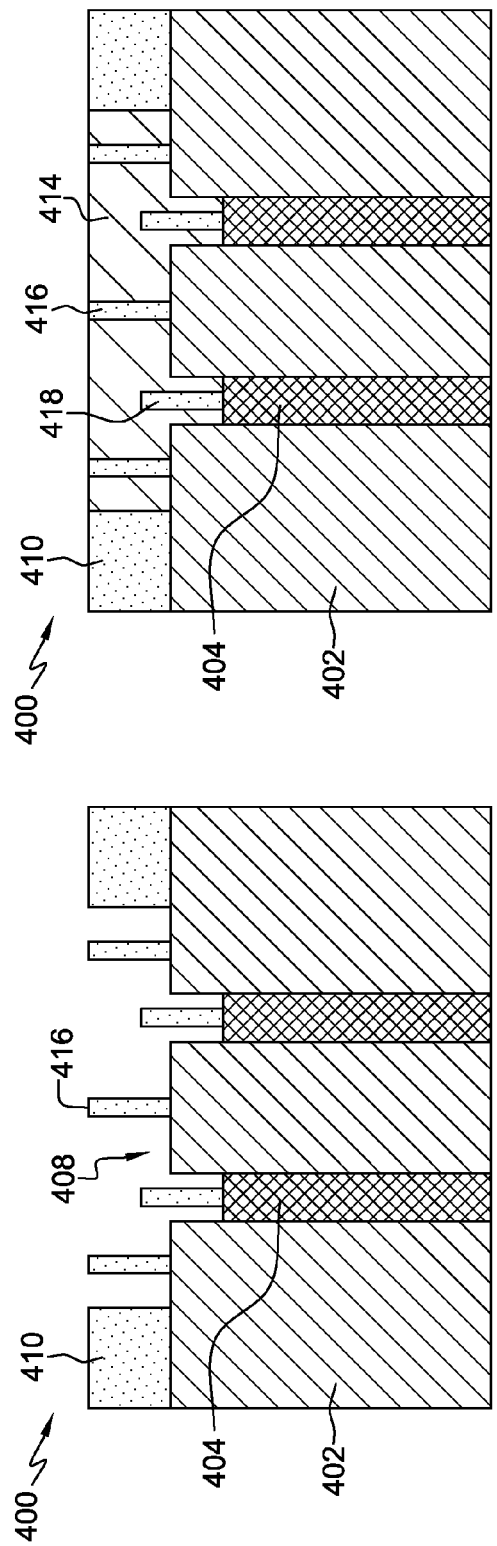

ENHANCED CAPTURE PADS FOR THROUGH SEMICONDUCTOR VIAS

RELATED APPLICATION

The present application is a division of U.S. patent application Ser. No. 13/670,694, entitled "ENHANCED CAPTURE PADS FOR THROUGH SEMICONDUCTOR VIAS", filed Nov. 7, 2012, the disclosure of which is incorporated by reference herein.

BACKGROUND

The present exemplary embodiments relate to semiconductor substrates that have through silicon vias and, more particularly, relate to the formation of capture pads in contact with the through silicon vias that enhance the current spreading ability of the capture pad.

Three-dimensional (3D) stacking of semiconductor chips promises higher transistor densities and smaller footprints of electronic products. 3D stacking is a single package containing a vertical stack of semiconductor chips which are interconnected by means of through silicon vias (TSVs). 3D stacking based on TSVs offers the benefits of more functionality, higher bandwidth and performance at smaller sizes, alongside lower power consumption and cost, even in an era in which conventional feature-size scaling becomes increasingly difficult and expensive. TSVs provide an electrical connection from the active front-side (face) of a semiconductor chip through the semiconductor substrate to the back-side of the substrate. TSVs allow a semiconductor chip or wafer to be vertically interconnected to another semiconductor chip or wafer. TSVs also allow the interconnection of multiple vertically stacked semiconductor chips or wafers with each other.

BRIEF SUMMARY

The various advantages and purposes of the exemplary embodiments as described above and hereafter are achieved by providing, according to a first aspect of the exemplary embodiments, a method of forming a capture pad on a semiconductor substrate which includes: providing a semiconductor substrate having an active side and an inactive side and having a plurality of unfilled through silicon vias (TSVs) extending between the active side and the inactive side; filling the TSVs with a metal; defining capture pad areas on at least one of the active side and the inactive side adjacent to the TSVs, the defined capture pad areas comprising insulator islands and open areas; and filling the open areas with the same metal to form a capture pad in direct contact with each of the TSVs, each of the capture pads having an all metal portion devoid of the insulator islands that follows an outline of each of the TSVs and a mixed portion comprising insulator islands dispersed in the metal.

According to a second aspect of the exemplary embodiments, there is provided a method of forming a capture pad on a semiconductor substrate which includes: providing a semiconductor substrate having an active side and an inactive side and having a plurality of unfilled through silicon vias (TSVs) extending between the active side and the inactive side; filling the TSVs with a metal; defining capture pad areas on at least one of the active side and the inactive side adjacent to the TSVs, the defined capture pad areas comprising insulator islands and open areas; and filling the open areas with the same metal to form a capture pad in direct contact with each of the TSVs, each of the capture pads having a TSV outline portion that follows an outline of each of the TSVs, at least part of each of the TSV outline portions being an all metal portion that follows the outline of each of the TSVs.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 4A to 4D illustrate a first exemplary method for making the semiconductor substrate of FIGS. 3A and 3B.

DETAILED DESCRIPTION

Figure 1:
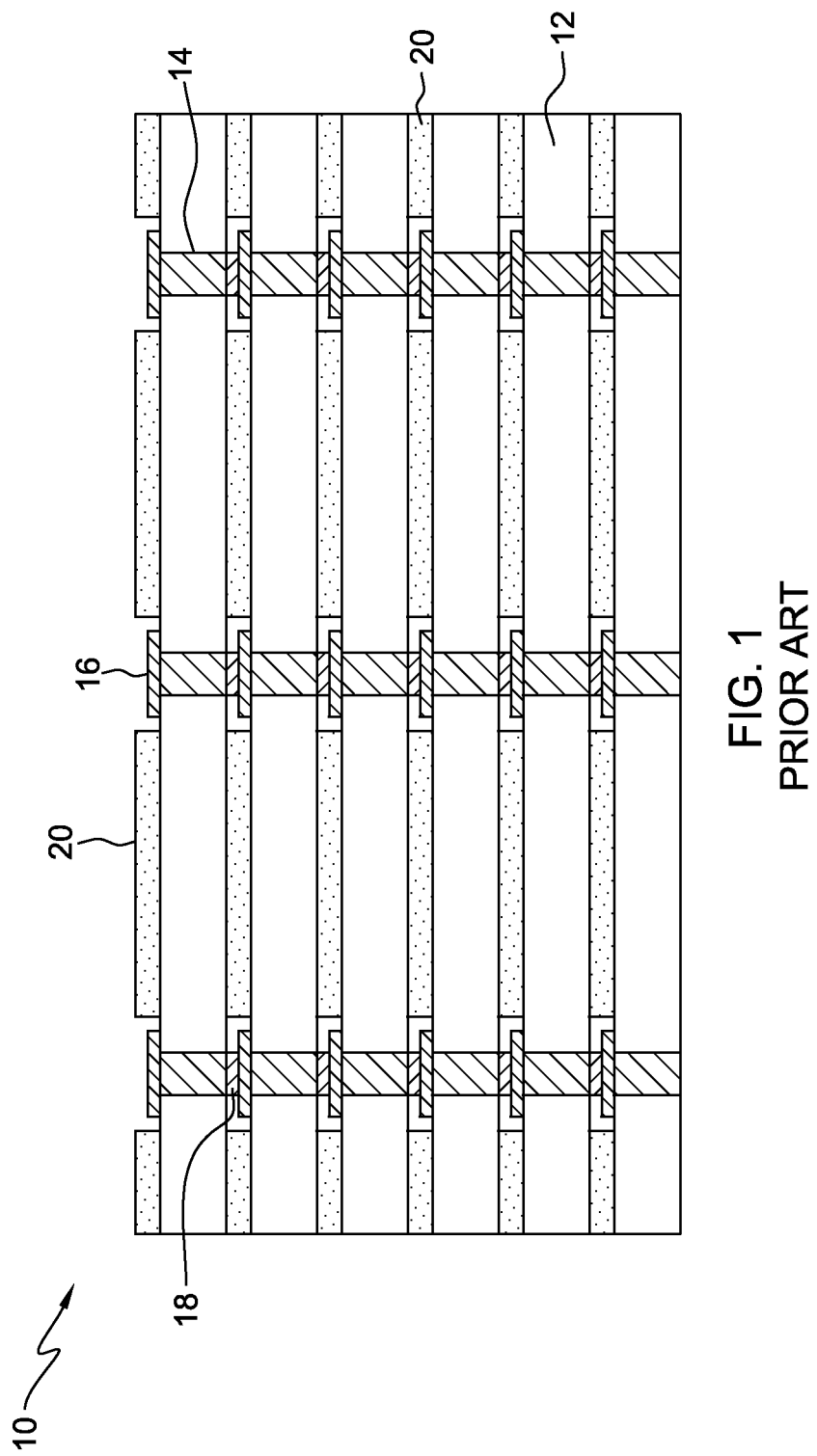
FIG. 1 is a conventional 3D stack of semiconductor wafers having TSVs.

Referring to the Figures in more detail, and particularly referring to FIG. 1, there is shown, for purposes of illustration and not limitation, an implementation of a conventional 3D stack 10 of semiconductor wafers 12 containing a plurality of TSVs 14. Each semiconductor wafer 12 may have a capture pad 16 for, for example, connecting one TSV 14 to another TSV 14. The TSVs 14 are usually filled with a metal such as copper. There may be a joining material 18, such as copper or solder, to electrically connect the TSV 14 to the capture pad 16 on either end of the TSV 14. Each semiconductor wafer 12 may be joined to another semiconductor wafer 12 by a bonding layer 20, which may consist of adhesive or some other means not limited by the scope of this invention. After the 3D stack 10 has been formed, it may be diced into individual 3D stacks of semiconductor chips, each of which may contain a plurality of TSVs 14.

While the capture pad 16 may be used to connect one TSV 14 to another TSV 14, the capture pad 16 may also be used to connect to another device such as an interposer or a packaging substrate. There also may be additional wiring layers (not shown) on the capture pad 16 before the capture pad 16 connects indirectly to, for example, a solder ball which in turn may connect to a packaging substrate.

Moreover, the capture pad 16 may be on the active (device) side of the semiconductor wafer 12 or the inactive (silicon) side of the semiconductor wafer.

Although the prior art example represented in FIG. 1 illustrates a multiplicity of wafers joined together, a 3D stack may also comprise a multiplicity of semiconductor dies joined together. Wafer to wafer, or die to die, or die to wafer joining may be accomplished by various means known to those skilled in the art.

It should also be understood that while a TSV is usually referred to as a "through silicon" via because it may extend through a substrate comprising silicon, the TSV in fact may extend through semiconductor materials that do not include silicon. Even in this latter case, a TSV may still be referred to by a person skilled in the art as a "through silicon via" even though it may extend through semiconductor materials other than silicon. Alternatively, it may be referred to as a "through semiconductor via", a "through substrate via" or more simply a "through via".

Figure 2A:
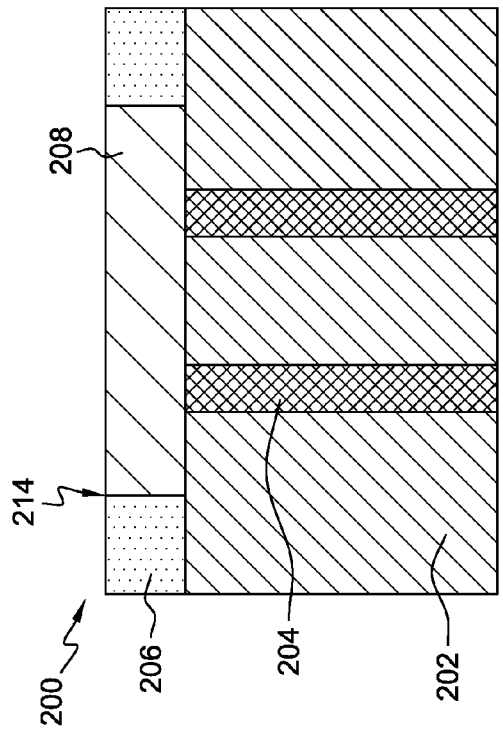
FIG. 2A is a side view of a conventional semiconductor substrate and FIG. 2B is a top view of a capture pad of the semiconductor substrate of FIG. 2A.
Figure 2B:
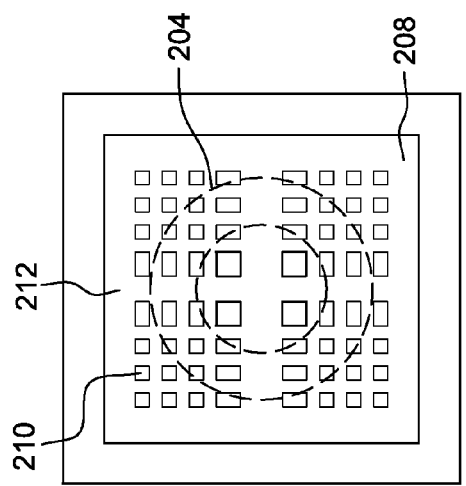

FIGS. 2A and 2B illustrate a conventional capture pad design. FIG. 2A illustrates a side view of a conventional semiconductor substrate 200. Semiconductor substrate 200 may comprise a semiconductor material 202 having a TSV 204 extending through the semiconductor material 202. TSV 204 is an annular TSV having a cross section similar to that of a ring. A capture pad area 214 has been defined by insulation 206 and then a capture pad 208 has been formed so as to be in contact with TSV 204. A top view of the capture pad 208 is shown in FIG. 2B with the annular TSV 204 shown in phantom. The capture pad 208 may be formed by depositing an insulator material within the capture pad area 214 followed by etching to remove most of the insulator, leaving insulator islands 210. Thereafter, capture pad metal, such as copper, is deposited to result in capture pad 208 comprising insulator islands 210 within a matrix of metal 212.

The present inventors have found that the conventional capture pad design shown in FIGS. 2A and 2B may result in current crowding or high current density. The present inventors have found that current crowding at the capture pad interface may be the limiting factor for the current capacity of the structure. Accordingly, the present inventors have proposed an enhanced capture pad which reduces current crowding by enhancing current spreading.

Figure 3A:
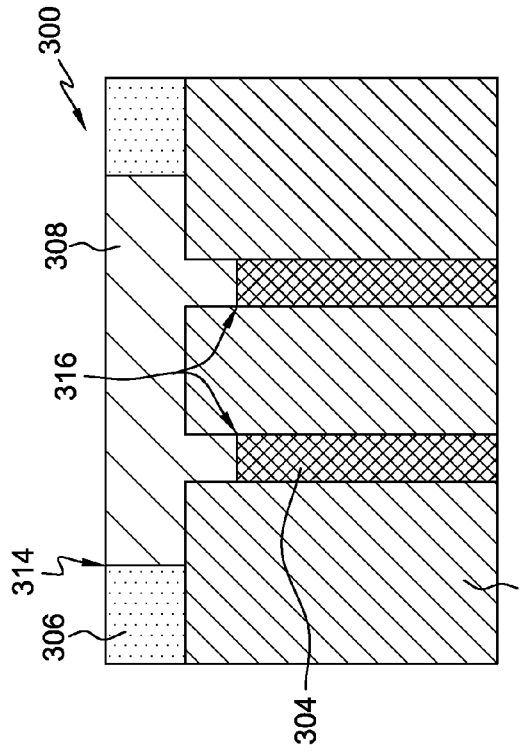
FIG. 3A is a side view of an exemplary embodiment of a semiconductor substrate and FIG. 3B is a top view of a capture pad of the semiconductor substrate of FIG. 3A.
Figure 3B:
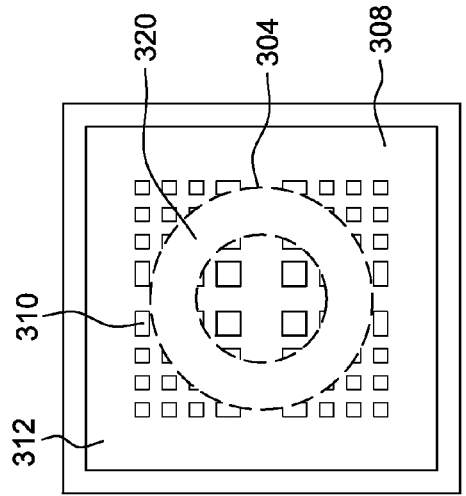

Referring now to FIGS. 3A and 3B, there is shown an exemplary embodiment. FIG. 3A illustrates a side view of semiconductor substrate 300. Semiconductor substrate 300 comprises a semiconductor material 302 having a TSV 304 extending through the semiconductor material 302. Any semiconductor material may be used in the exemplary embodiments. The semiconductor substrate 300 may be a bulk semiconductor substrate or a semiconductor on insulator substrate.

In the embodiment shown in FIGS. 3A and 3B, TSV 304 may extend to the inactive side of the semiconductor substrate 300. For purposes of illustration and not limitation, the top side of semiconductor substrate 300 may be the inactive side shown in FIG. 3A. TSV 304 is an annular TSV and has been recessed as indicated at 316. A capture pad area 314 has been defined by insulation 306 and then a capture pad 308 has been formed so as to be in contact with TSV 304. The method of recessing the TSV 304 and forming the capture pad 308 will be discussed in more detail hereafter. A top view of the capture pad 308 is shown in FIG. 3B. The appearance of capture pad 308 is distinctly different from capture pad 208 (FIGS. 2A and 2B). While not wishing to be held to any particular theory, it is believed by the present inventors that by recessing the TSV 304, the radically different capture pad 308 may be obtained even though both capture pad 308 and capture pad 208 were lithographically printed and etched in the same manner. While capture pad 308 contains insulator islands 310 within a matrix of metal 312, there is also a portion 320 which corresponds to the outline of the TSV 304, shown in phantom. Portion 320 is all metal and is devoid of the insulator islands on the surface of portion 320 that are present elsewhere on the capture pad 308.

An advantage of the exemplary embodiments is that an enhanced capture pad is formed. In addition, because of the recessed TSV 304, the capture pad 308 is self-aligned to the TSV 304.

Referring now to FIGS. 4A to 4D, there is illustrated a first method for recessing the TSV and forming the capture pad of the exemplary embodiments. In FIG. 4A, there is illustrated semiconductor substrate 400 comprising semiconductor material 402 and having an annular TSV 404 formed by conventional means. TSV 404 extends all the way to a surface 412 of semiconductor substrate 400. For purposes of illustration and not limitation, surface 412 may be the inactive side of semiconductor substrate 400. The TSV 404 may be filled with a metal such as copper.

Referring to FIG. 4B, semiconductor substrate 400 has been exposed to an etchant that is selective to the metal in the TSV 404. If the TSV 404 is filled with copper, chemical etchants such as cupric peroxide, ferric chloride, acetic peroxide may be used to recess the TSV 404 from surface 412 to form recess 406. Any other etchant that etches copper may also be used.

Thereafter, as shown in FIG. 4C, a capture pad area 408 may be defined by depositing an insulator layer 410, such as an oxide, and then by a lithographic and etching process, removing the insulator layer 410 where it is desired to have a capture pad such as a copper capture pad. The insulator layer 410 that is deposited is of a conformal nature and it will follow the topography of the upper most surface of FIG. 4B. Insulator islands 416 remain within the capture pad area 408. It is noted that insulator islands within recess 406 are below the surface of insulator layer 410.

Referring now to FIG. 4D, copper is deposited, for example by a plating process, to fill the recess 406, join with the TSV 404 and form capture pad 414. The copper may overflow the insulator islands 418 that are within the recess 406 so that the insulator islands 418 are buried within the capture pad 414 and not visible at the surface of the capture pad 414. A top view of capture pad 414 may have the configuration shown in FIG. 3B.

Figure 5B:
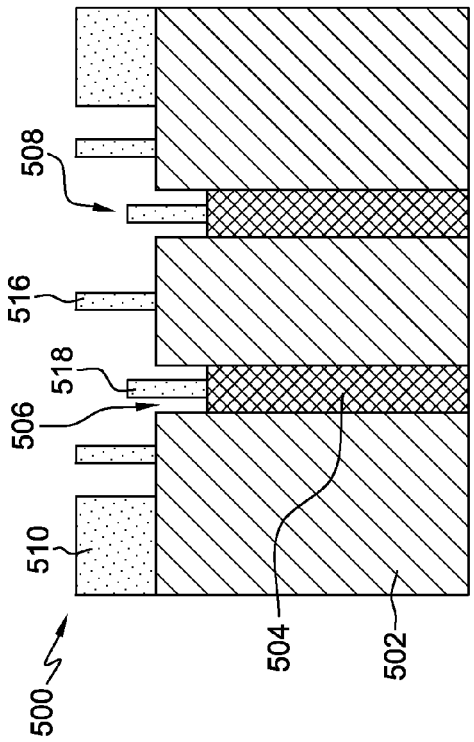
FIGS. 5A to 5C illustrate a second exemplary method for making the semiconductor substrate of FIGS. 3A and 3B.
Figure 5A:
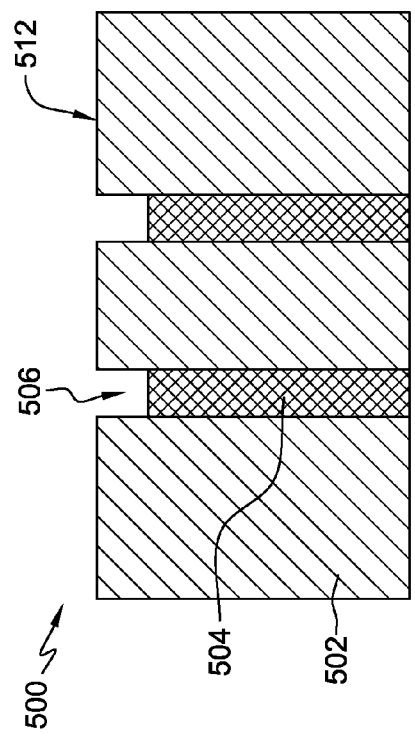
Figure 5C:
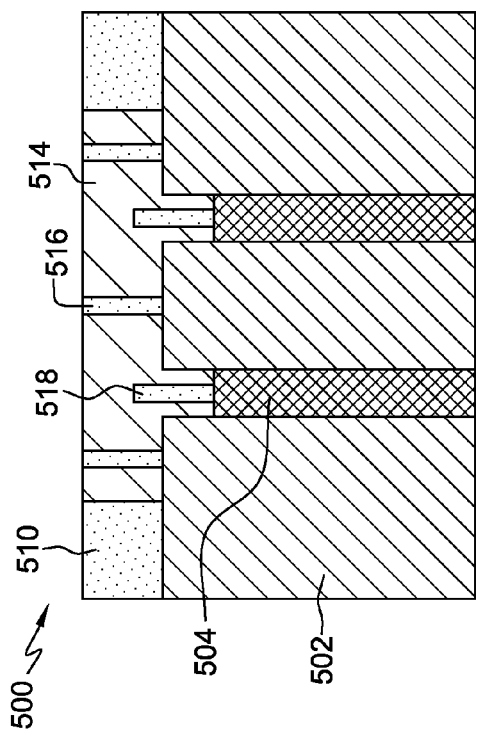

Referring now to FIGS. 5A to 5C, there is illustrated a second method for recessing the TSV and forming the capture pad. In FIG. 5A, there is illustrated semiconductor substrate 500 comprising semiconductor material 502 and having an annular TSV 504 formed by conventional means. The TSV 504 may be filled with a metal such as copper. It is noted that the TSV 504 does not extend all the way to the surface 512 of semiconductor substrate 500. For purposes of illustration and not limitation, surface 512 may be the inactive side of semiconductor substrate 500. Thus, TSV 504 is only partially filled so as to leave a recess 506.

Referring to FIG. 5B, a capture pad area 508 may be defined by depositing an insulator layer 510, such as an oxide, and then by a lithographic and etching process, removing the insulator layer 510 where it is desired to have copper. Insulator islands 516 remain within the capture pad area 508. Insulator islands 518 are within recess 506 and are below the surface of insulator layer 510.

Referring now to FIG. 5C, copper is deposited, for example by a plating process, to fill the recess 506, join with the TSV 504 and form capture pad 514. The copper may overflow the insulator islands 518 that are within the recess 506 so that the insulator islands 518 are buried within the capture pad 514 and not visible at the surface of the capture pad 514. A top view of capture pad 514 may have the configuration shown in FIG. 3B.

Figure 6:
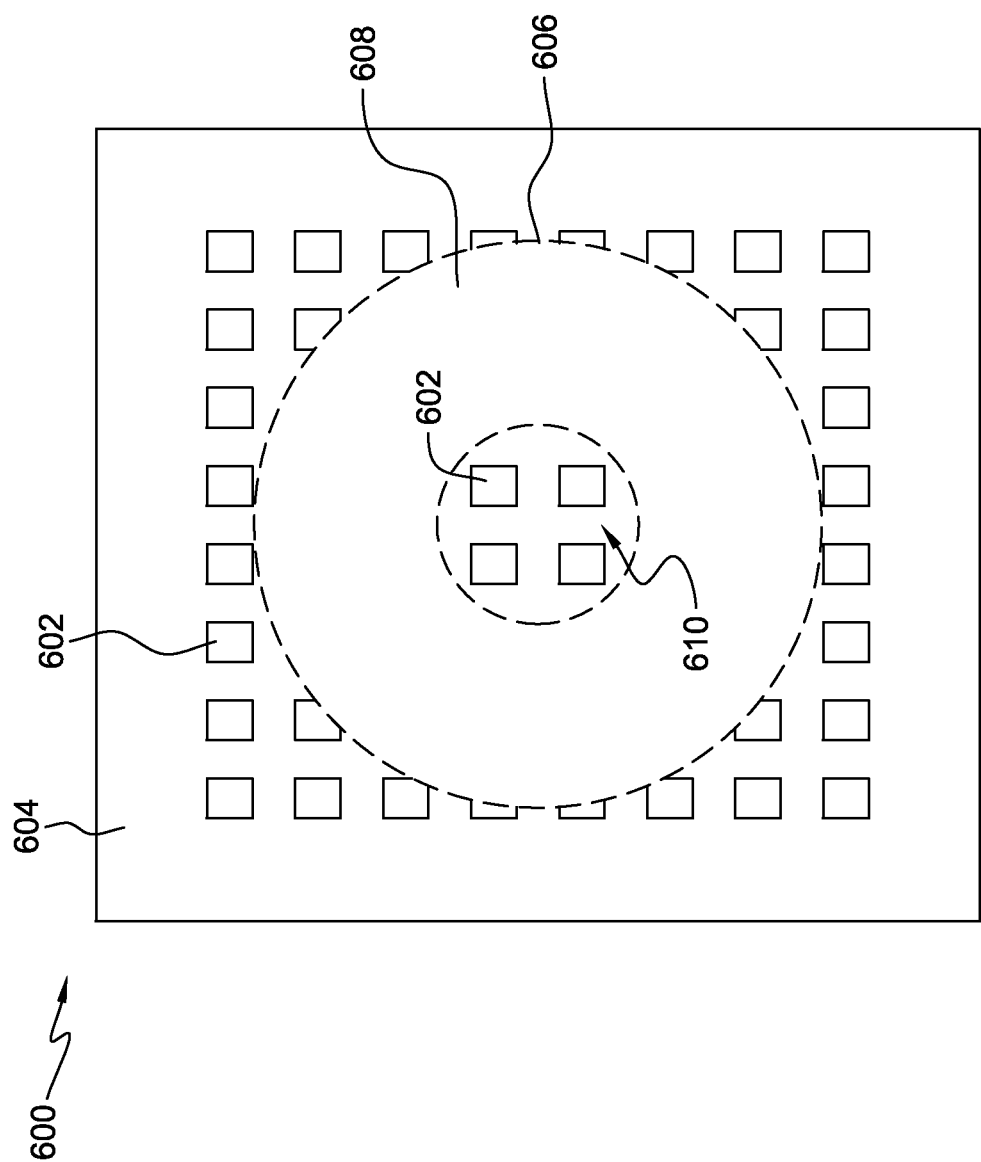
FIG. 6 is a top view of another exemplary embodiment of a capture pad.

FIG. 6 illustrates a capture pad 600 that may be made even if the underlying TSV is not recessed. In this case, capture pad 600 has been lithographically printed and etched to have islands 602 of insulator, for example, an oxide, within a matrix 604 of metal such as copper. A center 608 of the capture pad 600 aligns with a TSV 606 below the capture pad.

TSV 606 is shown in phantom since it is below the capture pad 600. In the center 608 of the capture pad 600 that aligns with the TSV 606, there are no insulator islands, only metal. However, since the TSV 606 is annular and not solid, a central portion 610 of capture pad 600 which does not overlie the TSV 606 does contain insulator islands 602. If TSV 606 was solid, the insulator islands 602 in central portion 610 would not be there. Contrary to the embodiments shown in FIGS. 4A to 4D and 5A to 5C, there are no insulator islands 602 buried underneath the surface of center 608.

In the exemplary embodiments, surfaces 412, 512 were chosen as the inactive sides of semiconductor substrates 400, 500 and the bottom surfaces were the active sides. Since the capture pads of the exemplary embodiments may be on the inactive sides or active sides of the semiconductor substrates 400, 500, surfaces 412, 512 could also have been the active sides of semiconductor substrates 400, 500.

An annular TSV (304, 404, 504, 606) has been shown in the exemplary embodiments but it should be understood that the exemplary embodiments are applicable to solid TSVs as well.

The exemplary embodiments of the semiconductor substrates described herein may be joined to other semiconductor substrates to form three-dimensional semiconductor structure.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of forming a capture pad on a semiconductor substrate comprising:
    providing a semiconductor substrate having an active side and an inactive side and having a plurality of unfilled through silicon vias (TSVs) extending between the active side and the inactive side;
    filling the TSVs with a metal;
    defining capture pad areas on at least one of the active side and the inactive side adjacent to the TSVs, the defined capture pad areas comprising insulator islands and open areas; and
    filling the open areas with the same metal to form a capture pad in direct contact with each of the TSVs, each of the capture pads having an all metal portion devoid of the insulator islands that follows an outline of each of the TSVs and a mixed portion comprising insulator islands dispersed in the metal.

2. The method of claim 1 wherein each of the capture pads have a first portion in direct contact with the TSVs and a second portion away from the TSVs and in direct contact with the first portion, the all metal portion being only in the second portion of each of the capture pads.

3. The method of claim 1 wherein each of the capture pads have a first portion in direct contact with the TSVs and a second portion away from the TSVs and in direct contact with the first portion, the all metal portion being in the first and second portions of each of the capture pads so as to extend entirely through each of the capture pads.

4. The method of claim 1 wherein the step of filling comprises filling the TSVs only partially with the metal so that the TSVs are recessed with respect to the at least one of the active side and the inactive side and wherein the step of filling the open areas includes filling the recessed TSVs.

5. The method of claim 1 wherein the step of filling comprises filling the TSVs fully with the metal, further comprising etching to recess the TSVs with respect to the at least one of the active side and the inactive side and wherein the step of filling the open areas includes filling the recessed TSVs.

6. The method of claim 1 further comprising forming at least one additional layer of material directly on the capture pads.

7. The method of claim 1 wherein the capture pad is on the active side of the semiconductor substrate.

8. The method of claim 1 wherein the capture pad is on the inactive side of the semiconductor substrate.

9. The method of claim 1 wherein the metal comprises copper.

10. The method of claim 1 further comprising joining the semiconductor substrate to at least one other semiconductor substrate to form a 3-dimensional semiconductor structure.

11. A method of forming a capture pad on a semiconductor substrate comprising:
    providing a semiconductor substrate having an active side and an inactive side and having a plurality of unfilled through silicon vias (TSVs) extending between the active side and the inactive side;
    filling the TSVs with a metal;
    defining capture pad areas on at least one of the active side and the inactive side adjacent to the TSVs, the defined capture pad areas comprising insulator islands and open areas; and
    filling the open areas with the same metal to form a capture pad in direct contact with each of the TSVs, each of the capture pads having a TSV outline portion that follows an outline of each of the TSVs, at least part of each of the TSV outline portions being an all metal portion that follows the outline of each of the TSVs.

12. The method of claim 11 wherein the TSV outline portions have a first portion in direct contact with each of the TSVs and a second portion away from each of the TSVs and in direct contact with the first portion, the all metal portion being only in the second portion of each of the capture pads, the first and second portions being an entire thickness of each of the capture pads.

13. The method of claim 11 wherein the TSV outline portions have a first portion in direct contact with each of the TSVs and a second portion away from each of the TSVs and in direct contact with the first portion, the all metal portion being in the first and second portions of each of the capture pads so as to extend entirely through each of the capture pads.

14. The method of claim 11 wherein the step of filling comprises filling the TSVs only partially with the metal so that the TSVs are recessed with respect to the at least one of the active side and the inactive side and wherein the step of filling the open areas includes filling the recessed TSVs.

15. The method of claim 11 wherein the step of filling comprises filling the TSVs fully with the metal, further comprising etching to recess the TSVs with respect to the at least one of the active side and the inactive side and wherein the step of filling the open areas includes filling the recessed TSVs.

16. The method of claim 11 further comprising forming at least one additional layer of material directly on the capture pads.

17. The method of claim 11 wherein the capture pad is on the active side of the semiconductor substrate.

18. The method of claim 11 wherein the capture pad is on the inactive side of the semiconductor substrate.

19. The method of claim 11 wherein the metal comprises copper.

* * * * *